US008402228B2

(12) United States Patent
Anand et al.

(10) Patent No.: US 8,402,228 B2
(45) Date of Patent: Mar. 19, 2013

(54) PAGE BUFFERING IN A VIRTUALIZED, MEMORY SHARING CONFIGURATION

(75) Inventors: Vaijayanthimala K. Anand, Austin, TX (US); David Navarro, Austin, TX (US); Bret R. Olszewski, Austin, TX (US); Sergio Reyes, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 443 days.

(21) Appl. No.: 12/827,818

(22) Filed: Jun. 30, 2010

(65) Prior Publication Data
US 2012/0005401 A1 Jan. 5, 2012

(51) Int. Cl.
G06F 12/08 (2006.01)
(52) U.S. Cl. .......... 711/147; 711/148; 711/203; 710/52; 718/104
(58) Field of Classification Search .......... 710/52; 711/147, 148, 203; 718/104
See application file for complete search history.

(56) References Cited

U.S. PATENT DOCUMENTS

| | | | |
|---|---|---|---|
| 6,470,380 B1 * | 10/2002 | Yoshizawa et al. | 709/213 |
| 6,651,182 B1 | 11/2003 | Chang et al. | |
| 7,082,509 B2 | 7/2006 | Zimmer et al. | |
| 7,337,296 B2 | 2/2008 | Noel et al. | |
| 7,490,330 B2 * | 2/2009 | Sexton et al. | 719/312 |
| 7,979,668 B2 * | 7/2011 | Hepkin et al. | 711/203 |
| 2005/0120160 A1 * | 6/2005 | Plouffe et al. | 711/1 |
| 2005/0144366 A1 * | 6/2005 | Fuse et al. | 711/103 |
| 2006/0107087 A1 | 5/2006 | Sieroka et al. | |
| 2008/0155246 A1 | 6/2008 | Jennings et al. | |

OTHER PUBLICATIONS

"Method and System to Charge CPU processing units to Client Partitions based on the Utilization of Virtual I/O Operations", *IBM* IP.com No. IPCOM000171482D Jun. 11, 2008, 3 pages.
"Method for Improving Replication of Virtual I/O Server Usage Patterns with HMC Mobile Partitions", *IBM* Jun. 5, 2009, 5 pages.
"Method to improve switching intelligence in a hypervisor virtual switch", *IBM* IP.com No. IPCOM000172863D Jul. 16, 2008, 3 pages.
"Support of a virtual disk on a Virtual IO Server using iSCSI software and Virtual Ethernet", *IBM* IP.com No. IPCOM000171481D Jun. 11, 2008, 2 pages.
Wegiel, Michal et al., "The mapping collector: Virtual memory support for generational, parallel, and concurrent compaction", *ASPLOS '08* Mar. 1, 2008, 13 pages.
Zhao, Weiming et al., "Dynamic Memory Balancing for Virtual Machines", *Proceedings of the 2009 ACM SIGPLAN/SIGOPS International Conference on Virtual Execution Environments, VEE '09* Jul. 15, 2009, 10 pages.

* cited by examiner

*Primary Examiner* — Jae Yu
(74) *Attorney, Agent, or Firm* — DeLizio Gilliam, PLLC

(57) ABSTRACT

An apparatus includes a processor and a volatile memory that is configured to be accessible in an active memory sharing configuration. The apparatus includes a machine-readable encoded with instructions executable by the processor. The instructions including first virtual machine instructions configured to access the volatile memory with a first virtual machine. The instructions including second virtual machine instructions configured to access the volatile memory with a second virtual machine. The instructions including virtual machine monitor instructions configured to page data out from a shared memory to a reserved memory section in the volatile memory responsive to the first virtual machine or the second virtual machine paging the data out from the shared memory or paging the data in to the shared memory. The shared memory is shared across the first virtual machine and the second virtual machine. The volatile memory includes the shared memory.

19 Claims, 7 Drawing Sheets

PAGE BUFFERING IN A VIRTUALIZED, MEMORY SHARING CONFIGURATION

BACKGROUND

Embodiments of the inventive subject matter generally relate to the field of memory, and, more particularly, to page buffering in a memory sharing configuration.

Virtualization technology allows for sharing of memory across multiple partitions or virtual machines. System memory is generally considered one of the most critical performance resources for a computer. In a memory management scheme that includes paging of data out from and into memory from a nonvolatile storage medium (e.g., a hard disk drive), system performance can be affected relative to the amount of paging that is required.

SUMMARY

Embodiments include an apparatus that includes an apparatus that comprises a processor. The apparatus also includes a volatile memory that is configured to be accessible in an active memory sharing configuration. The apparatus includes a machine-readable encoded with instructions executable by the processor. The instructions including first virtual machine instructions configured to access the volatile memory with a first virtual machine. The instructions including second virtual machine instructions configured to access the volatile memory with a second virtual machine. The instructions including virtual machine monitor instructions configured to page data out from a shared memory to a reserved memory section in the volatile memory responsive to the first virtual machine or the second virtual machine paging the data out from the shared memory or paging the data in to the shared memory. The shared memory is shared across the first virtual machine and the second virtual machine. The volatile memory includes the shared memory.

Embodiments include a method that includes booting up a computer device, wherein the booting up includes executing a virtual input/output (I/O) server having a reserved memory section in a volatile memory of the computer device. After booting up the computer device, a virtual machine monitor performs operations. The operations include receiving a first request to store a first data in the volatile memory from a first virtual machine. The operations include storing the first data in a shared memory section of the volatile memory, in response to the first request. The operations also include receiving a second request to store a second data in the volatile memory from a second virtual machine. The operations include, responsive to determining that a size of the second data is greater than a size of available memory space in the shared memory section in the volatile memory, paging out the first data stored in the shared memory section in the volatile memory to the reserved memory section in the volatile memory. Also in response to determining that a size of the second data is greater than a size of available memory space in the shared memory section in the volatile memory, the operations include storing the second data in the shared memory section in the volatile memory.

Embodiments include a computer program product for memory sharing. The computer program product includes a computer readable storage medium having computer readable program code embodied therewith. The computer readable program code configured to receive a first request to store a first data in the volatile memory by a first virtual machine. The computer readable program code configured to store the first data in a shared memory section of the volatile memory, in response to the first request. The computer readable program code also configured to receive a second request to store a second data in the volatile memory by a second virtual machine. The computer readable program code configured to perform the following operations, in response to a determination that a size of the second data is greater than a size of available storage in the shared memory section in the volatile memory. The following operations include page out of the first data stored in the shared memory section in the volatile memory to a reserved memory section in the volatile memory, wherein the reserved memory section is assigned to only be accessible by a module configured to control access to physical resources of a computer on which the computer program product is configured to execute. The following operations include storage of the second data in the shared memory section in the volatile memory.

Embodiments include a computer program product for memory sharing. The computer program product includes a computer readable storage medium having computer readable program code embodied therewith. The computer readable program code configured to boot up a computer device, wherein the boot up includes execution of a virtual input/output (I/O) server having a reserved memory section in a volatile memory of the computer device. The computer readable program code configured to perform the following operations after boot operations of the computer device have completed. The operations including receiving a first request to store a first data in the volatile memory by a first virtual machine. The operations including storing the first data in a shared memory section of the volatile memory, in response to the first request. The operations including receiving a second request to store a second data in the volatile memory by a second virtual machine. The operations including performing the following operations, in response to a determination that a size of the second data is greater than a size of available storage in the shared memory section in the volatile memory. The following operations including paging out the first data stored in the shared memory section in the volatile memory to the reserved memory section in the volatile memory. The following operations also including storing the second data in the shared memory section in the volatile memory.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
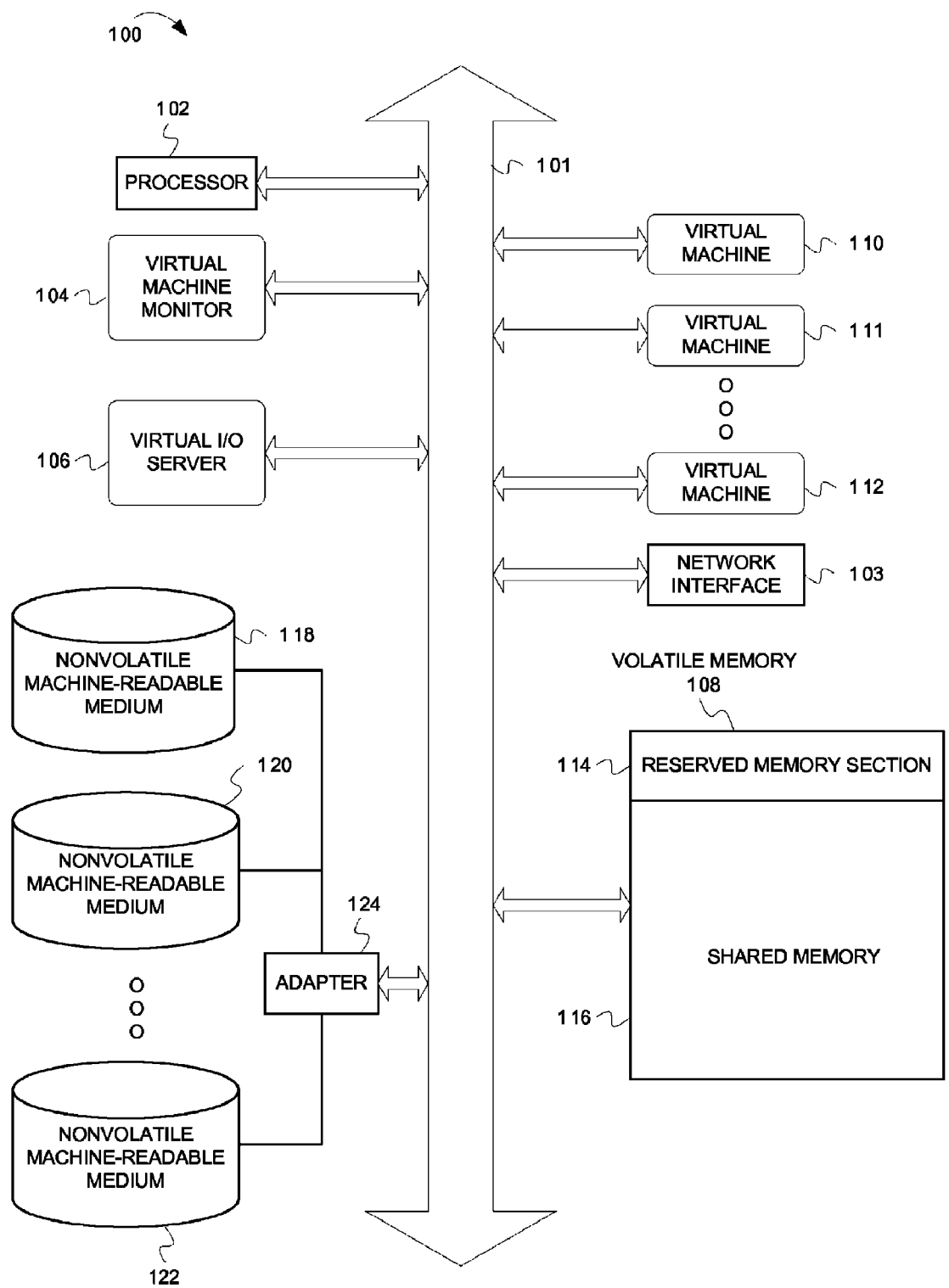
FIG. 1 is a block diagram illustrating a computer device with an active memory sharing configuration, according to some example embodiments.

The description that follows includes exemplary systems, methods, techniques, instruction sequences, and computer program products that embody techniques of the present inventive subject matter. However, it is understood that the described embodiments may be practiced without these specific details. In other instances, well-known instruction instances, protocols, structures, and techniques have not been shown in detail in order not to obfuscate the description.

Some example embodiments include virtualized environments that allow for sharing of memory across multiple virtual machines on one or more computer devices (e.g., servers). Some example embodiments include a virtual input output server ("VIOS" or "virtual I/O server"). A VIOS is an executing instance of instructions that facilitates sharing of physical resources between logical partitions (LPAR). An LPAR is generally a subset of a computer's hardware resources, where the subset is virtualized and an LPAR can operate as a separate computing device. In effect, a physical machine can be partitioned into multiple LPARs, each housing a separate operating system. A VIOS can operate as a partitioned hardware adapter and can service end devices or logical devices such as an Internet small computer system interface (iSCSI) adapter, compatible disks, Fibre-Channel disks, Ethernet drives, compact disks (CD), digital video disks (DVD), and optical drives or devices. A VIOS, therefore, can allow for sharing of physical resources of the device (s) among multiple virtual machines. For instance, a computer device can execute multiple operating system images at a same time while the operating systems are isolated from each other across multiple virtual machines. The multiple virtual machines can share a pool of volatile memory (e.g., Random Access Memory) that is managed across the multiple virtual machines. Management of the shared pool of volatile memory includes paging data in and out of the shared volatile memory. Some example embodiments use a buffered file system within a virtual I/O server to serve as the paging device for the shared volatile memory. A section of the volatile memory can be reserved ("reserved memory section") for use by the virtual I/O server during the boot up of the computer device. Accordingly, this reserved memory section for the virtual I/O server is reclaimed and applied towards improving the paging performance of an active memory sharing configuration.

This is in contrast to previous systems where a physical hard drive or a logical volume in such a hard drive is used as the paging device. Such systems are slower in comparison to some example embodiments because such systems have to access a disk drive to perform the paging activity. A virtual I/O server can have a file within a file system serve as a virtual drive. However, previous active memory sharing configurations do not allow for file-backed devices to serve as paging devices. Also, in previous systems, the virtual I/O server does not provide for buffering of file-backed devices. Accordingly, some example embodiments include support for file-backed devices in an active memory sharing configuration and support for buffering in a virtual I/O server.

Some example embodiments are configurable regarding which of the virtual machines can use, as the paging device, the reserved memory section for the virtual I/O server instead of a hard disk drive. The buffering by the virtual I/O server can be applied and removed to a file-backed paging device by mounting the file system with a proper release-behind mount options. Also, the amount of memory of the reserved memory section that can be used for paging is configurable. Accordingly, some example embodiments can now incorporate memory that is unused after boot up operations into paging operations, thereby increasing the performance of such systems.

While described such that the shared memory and the reserved memory are part of a same volatile memory, in some other example embodiments, the shared memory and the reserved memory are part of different memories in a same or different machine. Also, while described such that the reserved memory is reserved for access by the virtual I/O server, in some other embodiments, the reserved memory used for paging can be any other memory that is not accessible for sharing by multiple virtual machines in a virtualized, memory sharing configuration. For example, other modules or applications can have memory that is reserved for their use that can be used at least some of the time during paging operations.

FIG. 1 is a block diagram illustrating a computer device with an active memory sharing configuration, according to some example embodiments. A computer device 100 includes a processor 102 (possibly including multiple processors, multiple cores, multiple nodes, and/or implementing multi-threading, etc.). The computer device 100 includes a nonvolatile machine-readable medium 118, a nonvolatile machine-readable medium 120 and a nonvolatile machine-readable medium 122 that are communicatively coupled to the bus 101 through an adapter 124. The nonvolatile machine-readable media 118-122 can be various types of hard disk drives (e.g., optical storage, magnetic storage, etc.). The computer device 100 also includes a bus 101 (e.g., PCI, ISA, PCI-Express, HyperTransport®, InfiniBand®, NuBus, etc.) and a network interface 103 (e.g., an ATM interface, an Ethernet interface, a Frame Relay interface, SONET interface, wireless interface, etc.).

The computer device 100 includes a virtual machine monitor 104, a virtual I/O server 106 and a number of virtual machines (a virtual machine 110, a virtual machine 111 and a virtual machine 112). In some example embodiments, each of the virtual machines 110-112 serves as a software implementation of a machine. Each of the virtual machines 110-112 can provide a system platform that enables execution of an operating system. As further described below, the virtual machines 110-112 share physical resources of the computer device 100.

The virtual machine monitor 104 (also called a hypervisor) manages the interaction between each virtual machine and the underlying resources provided by the hardware platform (e.g., the volatile memory, the nonvolatile machine-readable media, network interfaces, etc.). The operations of the virtual machine monitor 104, the virtual I/O server 106 and the virtual machines 110-112 are described in more detail below. Any one of these operations can be partially (or entirely) implemented in hardware and/or on the processor 102. For example, the operations can be implemented with an application specific integrated circuit, in logic implemented in the processor 102, in a co-processor on a peripheral device or card, etc.

The computer device 100 includes a volatile memory 108. The volatile memory 108 can be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the below described possible realizations of machine-readable media. The volatile memory 108 includes at least the following sections: a reserved memory section 114 and a shared memory 116.

As further described below, the reserved memory section 114 is a section that is reserved for the virtual I/O server 106. The virtual I/O server 106 uses the reserved memory section 114 during the boot up operations of the computer device 100. Even after the boot up operations, the reserved memory section 114 is not released for generally memory use and remains reserved for the virtual I/O server 106. In some example embodiments, the virtual I/O server 106 allows the reserved memory section 114 to be used as a paging device for paging data from the shared memory 116.

The virtual machine monitor 104 controls access (e.g., read or write) to the shared memory 116 by the virtual machines 110-112. Also, the virtual machine monitor 104 pages out data from the shared memory 116 when space is need therein. For example, assume that the virtual machine 110 had filled the shared memory 116. Subsequently, assume that the virtual machine 111 needs to stored data in the shared memory 116. The virtual machine monitor 104 pages out at least some of the data (e.g., data stored by the virtual machine 110). In some example embodiments, instead of paging out the data to one of the nonvolatile machine-readable media 118-122, the virtual machine monitor 104 pages the data to the reserved memory section 114. Also, the virtual I/O server 106 can page out data from the reserved memory section 114 to one of the nonvolatile machine-readable media 118-122. Accordingly, the paging device for the shared memory is in the reserved memory section 114, thereby increasing performance of the computer device 100 when paging operations occur.

Further, realizations may include fewer or additional components not illustrated in FIG. 1 (e.g., video cards, audio cards, additional network interfaces, peripheral devices, etc.). The processor 102, the volatile memory 108, the nonvolatile machine-readable media 118-122, the virtual machine monitor 104, the virtual I/O server 106, the virtual machines 110-112, and the network interface 103 are coupled to the bus 101. Although illustrated as being coupled to a bus 101, the volatile memory 108 can be coupled to the processor 102.

FIGS. 2-5 are a series of conceptual diagrams illustrating different stages of paging in an active memory configuration having a virtual I/O server, according to some example embodiments. In particular, FIGS. 2-5 illustrate a page out operation from a shared memory to a reserved memory of a volatile memory of a computer device and a page out operation from the reserved memory to a nonvolatile machine-readable medium. For elements that are the same across FIGS. 2-5, a same numbering is used.

Figure 2:
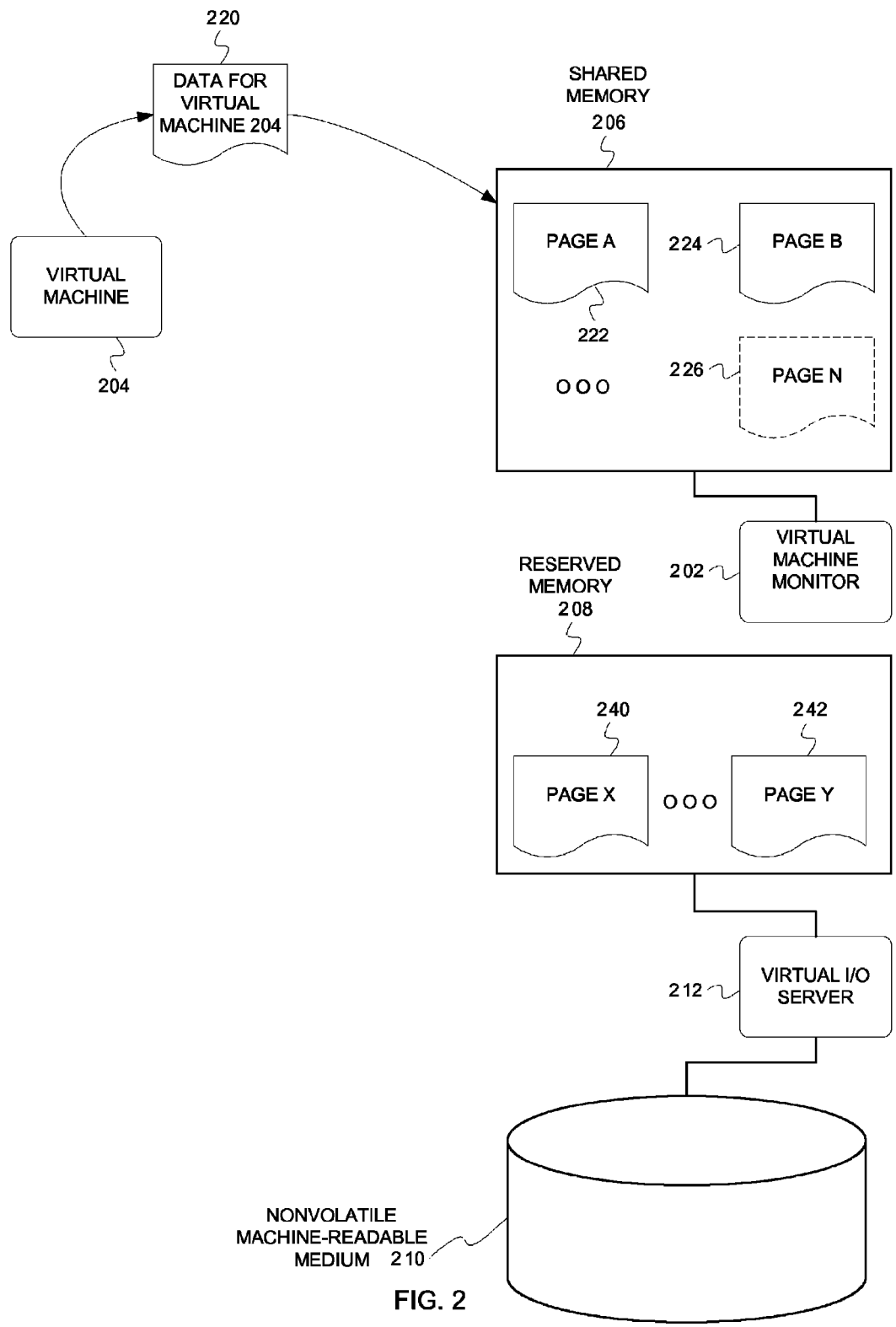
FIG. 2 is conceptual diagram of a first stage of paging in an active memory sharing configuration having a virtual input/output (I/O) server, according to some example embodiments.

FIG. 2 is conceptual diagram of a first stage of paging in an active memory sharing configuration having a virtual input/output (I/O) server, according to some example embodiments. FIG. 2 includes a shared memory 206 and a reserved memory 208 that are parts of a volatile memory of a computer device (as described above). FIG. 2 also includes a nonvolatile machine-readable medium 210, a virtual machine 204, a virtual machine monitor 202 and a virtual I/O server 212. The virtual machine monitor 202 is communicatively coupled to the shared memory 206. The virtual I/O server is communicatively coupled to the reserved memory 208 and the nonvolatile machine-readable medium 210. Although not shown, the virtual machine 204 is communicatively coupled to the shared memory 206.

For this example, prior to the operations illustrated in the first stage in FIG. 2, the shared memory 206 and the reserved memory 208 already have data stored therein. In particular, for the shared memory 206, the data is stored in a page A 222 and a page B 224. For the reserved memory 208, the data is stored in a page X 240 and a page Y 242. For example, this data can be stored therein because of previous data storage operations performed by other virtual machines. Also, assume that because of the storage of the pages X-Y 240-242, reserved memory 208 is filled to capacity that will initiate a page out operation to the nonvolatile machine-readable medium 210 if additional data is stored in the reserved memory 208 (as further described below).

In the first stage shown in FIG. 2, the virtual machine monitor 202 has granted to the virtual machine 204 access to the shared memory 206 (a shared resource). During execution, the virtual machine 204 stores data 220 into the shared memory 206. For example, an application (e.g., a word processing application) executing on the virtual machine 204 can cause storage of data (e.g., some or all of the contents of a document being processed by the application) into the shared memory 206. This data storage is shown as the storage of data into page N 226 within the shared memory 206. Also, for this example, assume that the storage of data into page N 226 causes the shared memory 206 to be filled to a capacity to require a page out operation if any additional data is stored in the shared memory 206.

Figure 3:
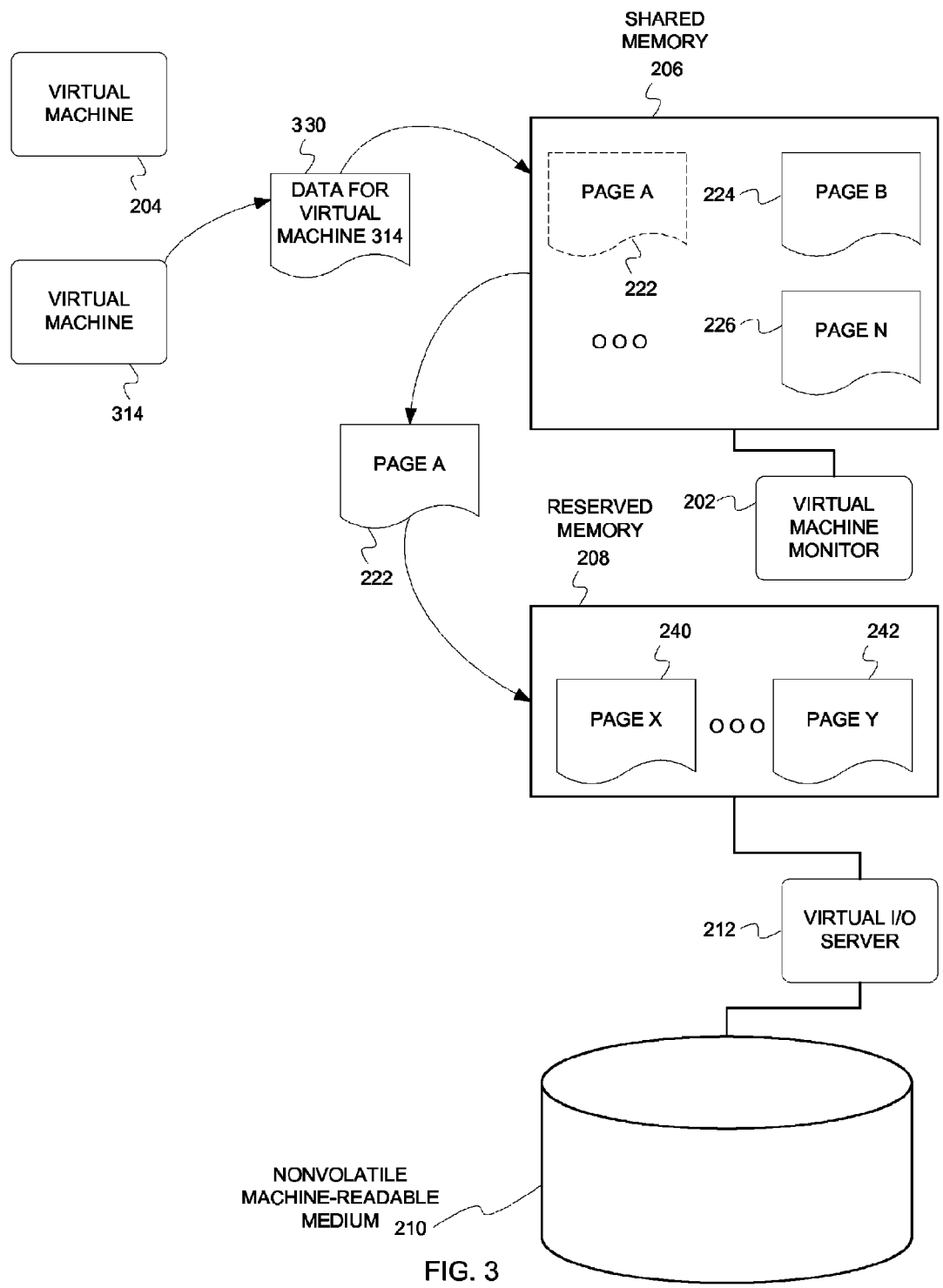
FIG. 3 is conceptual diagram of a second stage of paging in an active memory sharing configuration having a virtual input/output (I/O) server, according to some example embodiments.

FIG. 3 is conceptual diagram of a second stage of paging in an active memory sharing configuration having a virtual input/output (I/O) server, according to some example embodiments. FIG. 3 includes some of the same elements with the same numbering as FIG. 2. In this second stage, a virtual machine 314 is included. Although not shown, the virtual machine 314 is communicatively coupled to the shared memory 206.

In the second stage shown in FIG. 3, the virtual machine monitor 202 has granted to the virtual machine 314 access to the shared memory 206 (a shared resource). During execution, the virtual machine 314 stores data 330 into the shared memory 206. For example, an application (e.g., a power point application) executing on the virtual machine 314 can cause storage of data (e.g., some or all of the contents of a power point being processed by the application) into the shared memory 206. As described above, the shared memory 206 is filled to capacity after the first stage. Accordingly, in response to this data write operation to the shared memory 206, the virtual machine monitor 202 pages out the page A 222. In some example embodiments, the virtual machine monitor 202 pages out the "oldest" page in the shared memory 206. In particular, the virtual machine monitor 202 pages out the page having data that has been stored in the shared memory 206 for the longest time period. In some other example embodiments, the virtual machine monitor 202 can page out data based on other criteria. For example, the virtual machine monitor 202 can page out data relative to the virtual machine that has stored the data. For example, the virtual machine monitor 202 can first page out pages that have been stored by a virtual machine that currently does not have access to the shared memory 206 prior to paging out data stored by a virtual machine that currently does have access. The virtual machine monitor 202 pages out page A 222 to the reserved memory 208 (which is further described below in the subsequent stages).

Figure 4:
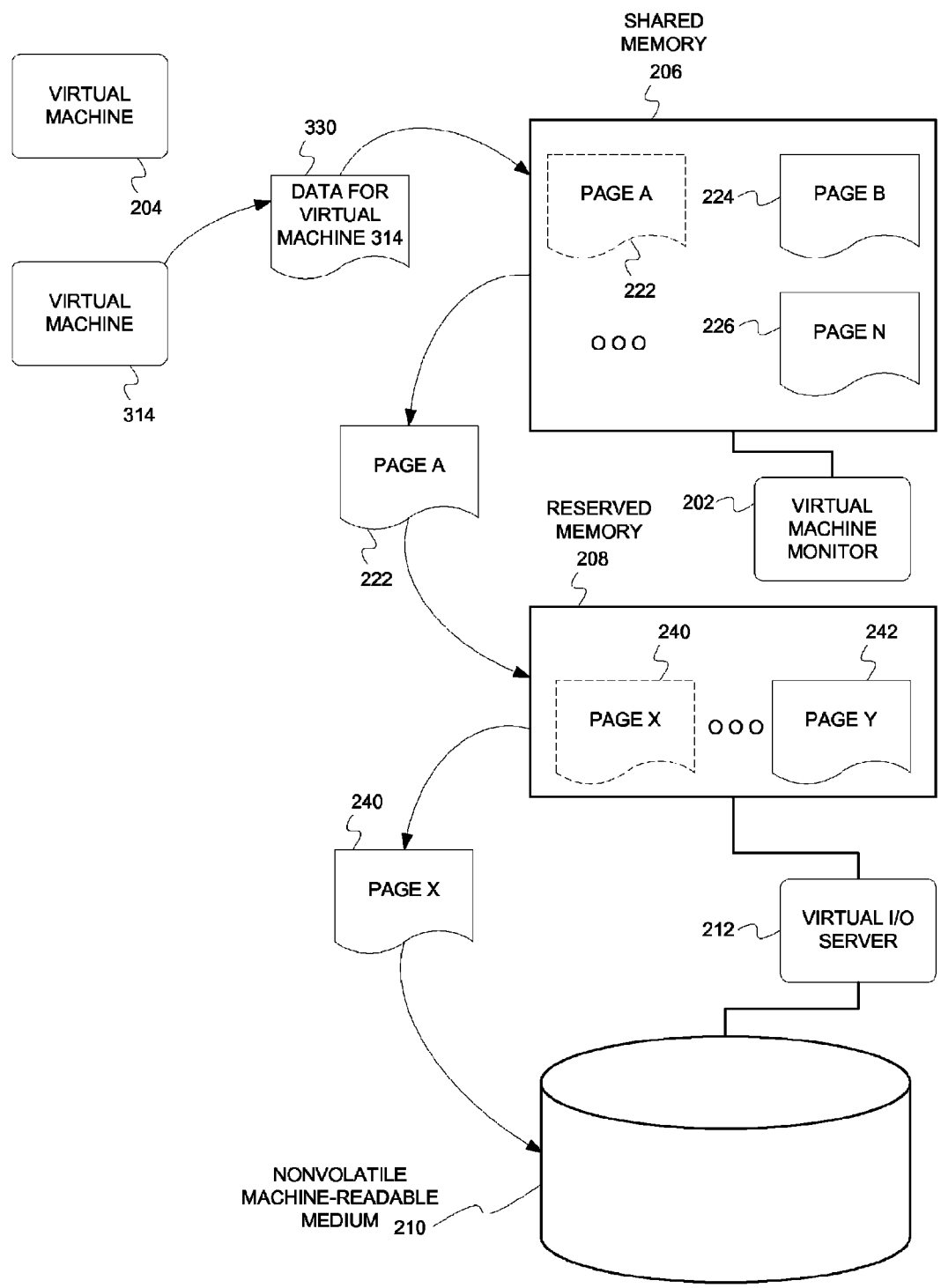
FIG. 4 is conceptual diagram of a third stage of paging in an active memory sharing configuration having a virtual input/output (I/O) server, according to some example embodiments.

FIG. 4 is conceptual diagram of a third stage of paging in an active memory sharing configuration having a virtual input/output (I/O) server, according to some example embodiments. FIG. 4 includes some of the same elements with the same numbering as FIGS. 2-3. In this third stage, because the reserved memory 208 is at capacity (as described above), the virtual I/O server (controlling the reserved memory 208) first pages out data from the reserved memory 208 to the nonvolatile machine-readable medium 210. In particular, the virtual I/O server 212 pages out page X 240 to the nonvolatile machine-readable medium 210. In some example embodiments, the virtual I/O server 212 pages out the "oldest" page in the reserved memory 208. In particular, the virtual I/O server 212 pages out the page having data that has been stored in the reserved memory 208 for the longest time period. In some other example embodiments, the virtual I/O server 212 can page out data based on other criteria (similar to those criteria for paging for shared memory 206).

Figure 5:
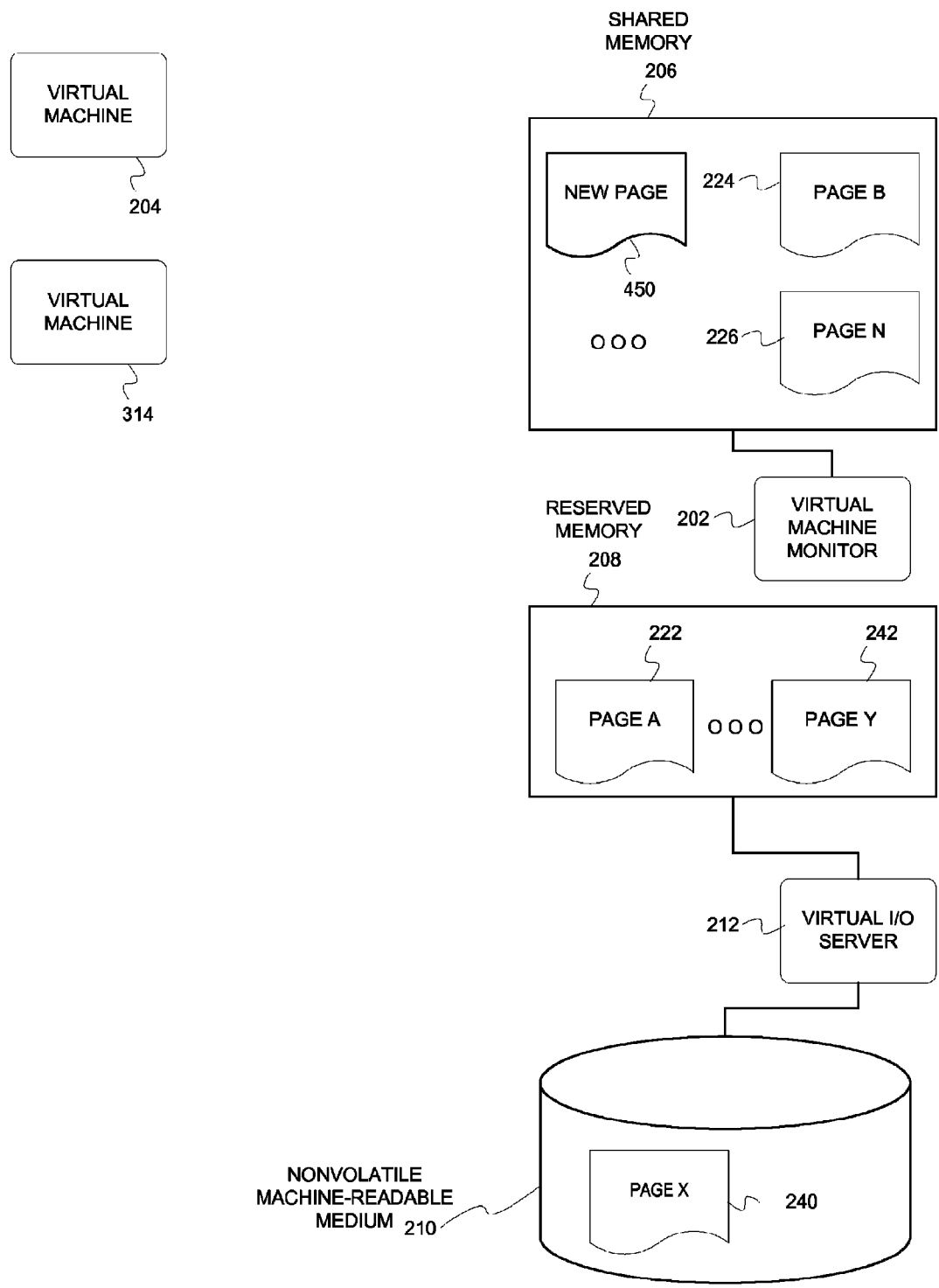
FIG. 5 is conceptual diagram of a fourth stage of paging in an active memory sharing configuration having a virtual input/output (I/O) server, according to some example embodiments.

FIG. 5 is conceptual diagram of a fourth stage of paging in an active memory sharing configuration having a virtual input/output (I/O) server, according to some example embodiments. FIG. 5 includes some of the same elements with the same numbering as FIGS. 2-4. In this fourth stage, the new page 450 is created in the shared memory 206. The virtual machine 314 has created the new page 450 as a result of attempting to store the data 330 into the shared memory 330 (see FIGS. 3-4). In other words, the new page 450 includes the data 330. Also, the virtual I/O server 212 has stored the page A 222 that was a result of the page out operation from the shared memory 206.

FIGS. 2-5 illustrate a page out operation. Similar operations in reverse order can be performed for a page in operation for moving the data back into the shared memory 206. For example, the data can be transferred from the nonvolatile machine-readable medium to the reserved memory and back into the shared memory, using one or more page in operations.

Figure 6:
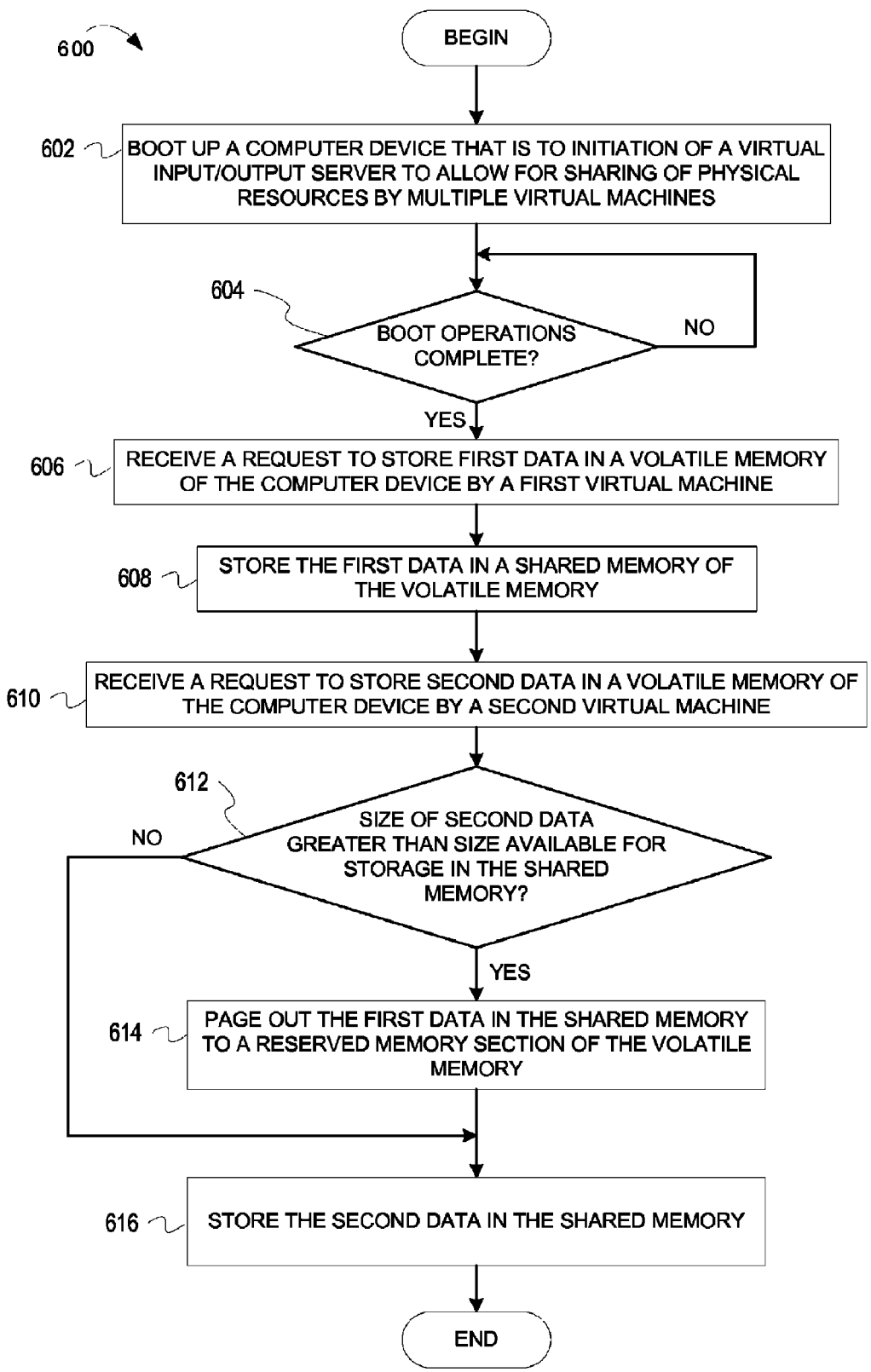
FIG. 6 is a flowchart of operations for paging from a shared memory into a reserved memory for a virtual I/O server, according to some example embodiments.
Figure 7:
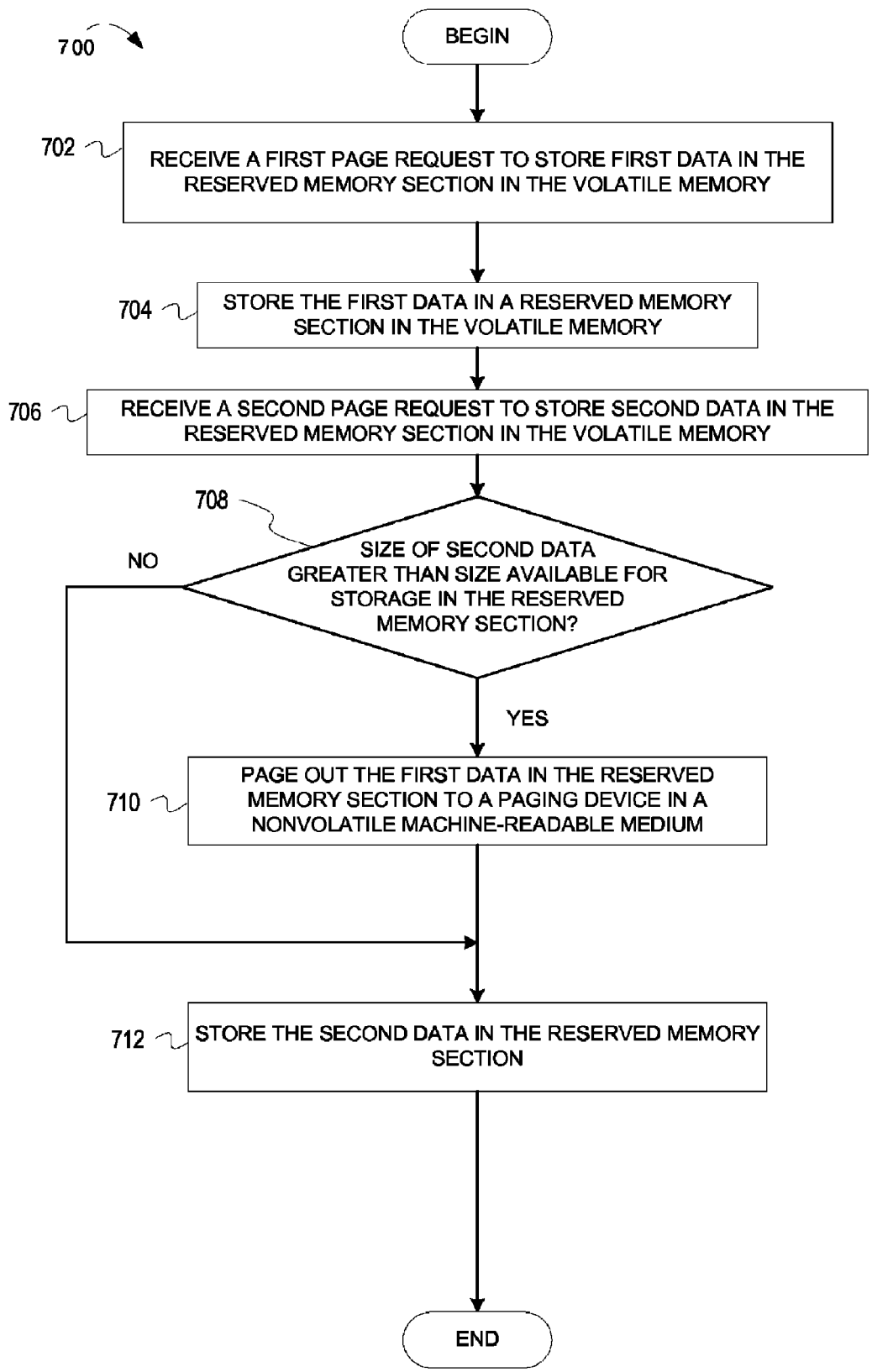
FIG. 7 is a flowchart of operations for paging from a reserved memory for a virtual I/O server to a nonvolatile machine-readable medium, according to some example embodiments.

Operations for page buffering in a virtualized, memory sharing configuration are now described. In certain embodiments, the operations can be performed by executing instructions residing on machine-readable media (e.g., software), while in other embodiments, the operations can be performed by hardware and/or other logic (e.g., firmware). In some embodiments, the operations can be performed in series, while in other embodiments, one or more of the operations can be performed in parallel. Moreover, some embodiments can perform less than all the operations shown in any flow diagram. Two different flowcharts are now described. FIG. 6 is a flowchart for operations for a page out operation from a shared memory to a reserved memory of a volatile memory. FIG. 7 is a flowchart for operations for a page out operation from the reserved memory of the volatile memory to a nonvolatile machine-readable medium.

In particular, FIG. 6 is a flowchart of operations for paging from a shared memory into a reserved memory for a virtual I/O server, according to some example embodiments. A flow diagram 600 includes operations that, in some example embodiments, are performed by the different modules described in reference to FIGS. 1-5. Therefore, FIG. 6 is described with reference to FIGS. 1-5. The operations of the flow diagram 600 begin at block 602.

At block 602, a computer device is booted up. The boot up operations include the initiation of a virtual I/O server to allow for sharing of physical resources by multiple virtual machines. The virtual I/O server 106 can serve as an intermediary between the virtual machines and the operating system executing on the computer device. In the virtualized configuration of the computer device, the virtual machines can share volatile memories, nonvolatile machine-readable media, network interfaces, etc. In some example embodiments, the virtual I/O server 106 is assigned a section of the volatile memory 108 (i.e., the reserved memory section 114). The virtual I/O server 106 accesses the reserved memory section 114 during the boot up operations of the computer device. Also, the reserved memory section 114 remains dedicated for use by the virtual I/O server 106 after the boot operations are complete. Operations continue at block 604.

At block 604, the virtual I/O server 106 determines whether the boot operations are complete. If not complete, the virtual I/O server 106 continues making this determination at block 604. In particular, the reserved memory section 114 is not accessible as a paging device for the pages from the shared memory 116 until the virtual I/O server 106 is completed its use of the reserved memory section 114 for boot operations. Otherwise, operations continue at block 606.

At block 606, the virtual machine monitor 104 receives a request to store a first data in a volatile memory 108 of the computer device by a first virtual machine 110. For example, an application or program (e.g., a word processing application) can be executing in the first virtual machine 110 such that data is to be stored in memory. Accordingly, the first virtual machine 110 requests storage of data into the shared memory 116. As described above, the virtual machine monitor 104 controls access to the shared memory 116 by the different virtual machines executing in the computer device 100. With reference to the example shown in FIGS. 2-5, this request operation is shown by the virtual machine 204 transmitting the data 220 to the shared memory 206 in FIG. 2. Operations continue at block 608.

At block 608, the virtual machine monitor 104 stores the first data in a shared memory 116 of the volatile memory 108. Prior to storage in the shared memory 116, the virtual machine monitor 104 determines whether there is available space in the shared memory 116. In this example, the virtual machine monitor 104 has determined that there is available space in the shared memory 116 for storage of the first data. With reference to the example shown in FIGS. 2-5, this storage operation is shown by the storage of data in the page N 226 in FIGS. 2-3. Operations continue at block 610.

At block 610, the virtual machine monitor 104 receives a request to store a second data in the volatile memory 108 of the computer device by a second virtual machine 111. Accordingly, a different virtual machine is now attempting to access the shared memory 116. The virtual machine monitor 104 authorizes accesses to the shared memory 116 by any of the virtual machines. With reference to the example shown in FIGS. 2-5, this request operation is shown by the virtual machine 314 transmitting the data 330 to the shared memory 206. Operations continue at block 612.

At block 612, the virtual machine monitor 104 determines whether a size of the second data is greater than a size of available space for storage in the shared memory 116 of the volatile memory 108. If the size of the second data is not greater than the size of available space for storage in the shared memory 116, operations continue at block 616 (further described below). Otherwise, operations continue at block 614.

At block 614, the virtual machine monitor 104 pages out data in the shared memory to a reserved memory section of the volatile memory. In this example, the virtual machine monitor 104 selects the first data as the data to be paged out of the shared memory. As described above, the virtual machine monitor 104 can use any of a number of different criteria (e.g., "oldest") for selection of the data to be paged out. Also, in some example embodiments, the virtual I/O server 106 controls access to the reserved memory section 114. Accordingly, the virtual I/O server 106 can receive and store the data being paged out into the reserved memory section 114. The operations of the virtual I/O server 106 are described in more detail below in the description of FIG. 7. With reference to the example shown in FIGS. 2-5, this page out operation is shown by the moving of the page A 222 from the shared memory 206 to the reserved memory 208 in FIGS. 3-4. Accordingly, instead of a nonvolatile machine-readable medium, a different section of memory is used as a page buffer or page device for the shared memory. Such a configuration increases the performance of paging because a write-to-disk operation is not required for the page out data. Operations continue at block 616.

At block 616, the virtual machine monitor 104 stores the second data in the shared memory. With reference to the example shown in FIGS. 2-5, this storage operation is shown by the storage of data in the new page 450 in FIG. 5. Operations of the flow diagram 600 are complete.

FIG. 7 is a flowchart of operations for paging from a reserved memory for a virtual I/O server to a nonvolatile machine-readable medium, according to some example embodiments. A flow diagram 700 includes operations that, in some example embodiments, are performed by the different modules described in reference to FIGS. 1-5. Therefore, FIG. 7 is described with reference to FIGS. 1-5. The operations of the flow diagram 700 begin at block 702.

At block 702, the virtual I/O server 106 receives a first page request to first data in the reserved memory section in the volatile memory. As described above, the page request is received from the virtual machine monitor 104 that is paging out data from the shared memory to allow for storage of new data therein. For example, a new virtual machine can be executing that requires storage of data in the shared memory. With reference to the example shown in FIGS. 2-5, this page request is shown by transmitting the page A 222 from the shared memory 206 to the reserved memory 208 in FIGS. 3-4. Operations continue at block 704.

At block 704, the virtual I/O server 106 stores the first data in a reserved memory section in the volatile memory. Prior to storage in the reserved memory 114, the virtual I/O server 106 determines whether there is available space in the reserved memory 114. In this example, the virtual I/O server 106 has determined that there is available space in the reserved memory 114 for storage of the first data. Operations continue at block 706.

At block 706, the virtual I/O server 106 receives a second page request to store second data in the reserved memory section in the volatile memory. With reference to the example shown in FIGS. 2-5, this receiving of a second page request is shown by receiving the page A 222 into the reserved memory 208 from the shared memory 206. Operations continue at block 708.

At block 708, the virtual I/O server 106 determines whether the size of the second data is greater than the size available for storage in the reserved memory section in the volatile memory. If the size of the second data is not greater than the size of available space for storage in the reserved memory 114, operations continue at block 714 (further described below). Otherwise, operations continue at block 712.

At block 710, the virtual I/O server 106 pages out the first data in the reserved memory section in the volatile memory to a paging device in a nonvolatile machine-readable medium. In this example, the virtual I/O server 106 selects the first data as the data to be paged out of the reserved memory. The virtual I/O server 106 can use any of a number of different criteria (e.g., "oldest") for selection of the data to be paged out. With reference to the example shown in FIGS. 2-5, this page out operation is shown by the moving of the page X 240 from the reserved memory 208 to the nonvolatile machine-readable medium 210 in FIGS. 4-5. Operations continue at block 712.

At block 712, the virtual I/O server 106 stores the second data in the reserved memory section from the shared memory. With reference to the example shown in FIGS. 2-5, this storage operation is shown by the storage of the page A 222 into the reserved memory 208 in FIGS. 4-5. Operations of the flow diagram 700 are complete.

Embodiments are not limited to the example flowcharts depicted in the above figures. Embodiments can perform additional operations, fewer operations, operations in parallel, etc. For instance, referring to FIG. 6, operations for paging out data from the shared memory and storing different data in the shared memory can be executed at least partially in parallel.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

While the embodiments are described with reference to various implementations and exploitations, it will be understood that these embodiments are illustrative and that the scope of the inventive subject matter is not limited to them. In general, techniques for optimizing design space efficiency as described herein may be implemented with facilities consistent with any hardware system or hardware systems. Many variations, modifications, additions, and improvements are possible.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. An apparatus comprising:
   a processor;
   a volatile memory configured to be accessible in an active memory sharing configuration;
   a machine-readable storage medium encoded with instructions executable by the processor, the instructions comprising,
      first virtual machine instructions configured to access the volatile memory with a first virtual machine;
      second virtual machine instructions configured to access the volatile memory with a second virtual machine; and
      virtual machine monitor instructions configured to page first data out from a shared memory to a reserved memory section in the volatile memory responsive to the first virtual machine or the second virtual machine paging second data out from the shared memory or paging the second data in to the shared memory, wherein the shared memory is shared across the first virtual machine and the second virtual machine and the volatile memory comprises the shared memory;
      virtual input/output server instructions configured to,
         receive a first page request to store the first data in the reserved memory section in the volatile memory;
         store the first data in the reserved memory section in the volatile memory;
         receive a second page request to store the second data in the reserved memory section in the volatile memory; and
         in response to a determination that the size of the second data is greater than a size of available memory space in the reserved memory section in the volatile memory,
            page out the first data in the reserved memory section in the volatile memory to a paging device in a nonvolatile machine-readable medium; and
         store the second data in the reserved memory section in the volatile memory.

2. The apparatus of claim 1, further comprising a virtual input/output (I/O) server, wherein the reserved memory section is accessible only by the virtual I/O server, wherein the virtual I/O server is configured to store the data paged out from the shared memory.

3. The apparatus of claim 2, wherein the virtual I/O server is configured to access the reserved memory section during boot operations of the apparatus, wherein the reserved memory section is configured to serve as a paging device for the operations to page data from the shared memory after the boot operations are complete.

4. The apparatus of claim 2, further comprising one or more nonvolatile machine-readable mediums, wherein the virtual I/O server is configured to page data from the reserved memory section to the one or more nonvolatile machine-readable mediums.

5. The apparatus of claim 4, wherein the one or more nonvolatile machine-readable medium are accessible through a single adapter, wherein the virtual I/O server is configured to page data from the reserved memory section to the one or more nonvolatile machine-readable mediums through the single adapter.

6. The apparatus of claim 1, wherein the virtual machine monitor instructions are configured to page out data that has been stored in the shared memory for the longest time.

7. The apparatus of claim 1, wherein the virtual machine monitor instructions are configured to page the data to the reserved memory section in the volatile memory in response to the first virtual machine attempting to store data in the shared memory and a determination insufficient space is available for storage of the data in the shared memory.

8. A method comprising:
   booting up a computer device, wherein the booting up includes executing instructions that instantiate a virtual input/output (I/O) server having a reserved memory section in a volatile memory of the computer device;
   after booting up the computer device, a virtual machine monitor,
      receiving a first request to store a first data in the volatile memory from a first virtual machine;
      storing the first data in a shared memory section of the volatile memory, in response to the first request;
      receiving a second request to store a second data in the volatile memory from a second virtual machine; and
      responsive to determining that a size of the second data is greater than a size of available memory space in the shared memory section in the volatile memory,
         paging out the first data stored in the shared memory section in the volatile memory to the reserved memory section in the volatile memory; and
         storing the second data in the shared memory section in the volatile memory;
   the virtual input/output server,
      receiving a first page request to store the first data in the reserved memory section in the volatile memory;
      storing the first data in the reserved memory section in the volatile memory;
      receiving a second page request to store the second data in the reserved memory section in the volatile memory; and
      in response to a determination that the size of the second data is greater than a size of available memory space in the reserved memory section in the volatile memory,
         paging out the first data in the reserved memory section in the volatile memory to a paging device in a nonvolatile machine-readable medium of the computer device; and
         storing the second data in the reserved memory section in the volatile memory.

9. The method of claim 8, wherein the computer device comprises another nonvolatile machine-readable medium, wherein the virtual I/O server is configured to access the nonvolatile machine-readable medium and the another nonvolatile machine-readable medium through a single adapter.

10. The method of claim 9, wherein the paging out of the first data comprises transmitting the first data through the single adapter to the nonvolatile machine-readable medium.

11. The method of claim 8, wherein paging out the first data in the shared memory section comprises paging out data that has been stored in the shared memory section for the longest time.

12. A computer program product for memory sharing, the computer program product comprising:
   a computer readable storage medium having computer readable program code embodied therewith, the computer readable program code configured to,
      receive a first request to store a first data in the volatile memory by a first virtual machine;
      store the first data in a shared memory section of the volatile memory, in response to the first request;
      receive a second request to store a second data in the volatile memory by a second virtual machine; and
      in response to a determination that a size of the second data is greater than a size of available storage in the shared memory section in the volatile memory,
         page out the first data stored in the shared memory section in the volatile memory to a reserved memory section in the volatile memory, wherein the reserved memory section is assigned to only be accessible by a module configured to control access to physical resources of a computer on which the computer program product is configured to execute; and
         store the second data in the shared memory section in the volatile memory;
      receive a first page request to store the first data in the reserved memory section in the volatile memory;
      store the first data in the reserved memory section in the volatile memory;
      receive a second page request to store the second data in the reserved memory section in the volatile memory; and
      perform the following operations, in response to a determination that the size of the second data is greater than a size of available stored in the reserved memory section in the volatile memory,
         page out the first data in the reserved memory section in the volatile memory to a paging device in a nonvolatile machine-readable medium of the computer device; and
      store the second data in the reserved memory section in the volatile memory.

13. The computer program product of claim 12, wherein the computer readable program code is configured to boot up the computer, that includes execution of the module, wherein the execution causes the module to access the reserved memory section.

14. The computer program product of claim 13, wherein the reserved memory section is accessible to receive the page out of the first data after the boot up of the computer is complete.

15. The computer program product of claim 12, wherein paging out the first data in the shared memory section comprises paging out data that has been stored in the shared memory section for the longest time.

16. A computer program product for memory sharing, the computer program product comprising:
   a computer readable storage medium having computer readable program code embodied therewith, the computer readable program code configured to,
      boot up a computer device, wherein the boot up includes executing instructions that instantiate a virtual input/output (I/O) server having a reserved memory section in a volatile memory of the computer device;
      after boot up of the computer device,
         receive a first request to store a first data in the volatile memory by a first virtual machine;
         store the first data in a shared memory section of the volatile memory, in response to the first request;
         receive a second request to store a second data in the volatile memory by a second virtual machine; and
         in response to a determination that a size of the second data is greater than a size of available storage in the shared memory section in the volatile memory,
            page out the first data stored in the shared memory section in the volatile memory to the reserved memory section in the volatile memory; and store the second data in the shared memory section in the volatile memory;

cause the virtual input/output server executing to, store the first data in the reserved memory section in the volatile memory responsive to receiving a first page request to store the first data in the reserved memory section in the volatile memory;

in response to receiving a second page request to store the second data in the reserved memory section in the volatile memory and a determination that the size of the second data is greater than a size of available storage in the reserved memory section in the volatile memory, page out the first data in the reserved memory section in the volatile memory to a paging device in a nonvolatile machine-readable medium of the computer device; and store the second data in the reserved memory section in the volatile memory.

17. The computer program product of claim 16, wherein the computer device comprises another nonvolatile machine-readable medium, wherein the virtual I/O server is configured to access the nonvolatile machine-readable medium and the another nonvolatile machine-readable medium through a single adapter.

18. The computer program product of claim 17, wherein the page out of the first data comprises transmission of the first data through the single adapter to the nonvolatile machine-readable medium.

19. The computer program product of claim 16, wherein page out the first data in the shared memory section comprises page out of data that has been stored in the shared memory section for the longest time.

* * * * *